United States Patent [19]

Hager et al.

[11] 4,000,508
[45] Dec. 28, 1976

[54] OHMIC CONTACTS TO P-TYPE MERCURY CADMIUM TELLURIDE

[75] Inventors: Robert J. Hager, Minneapolis; Eric S. Johnson, Minnetonka; M. Walter Scott, Minnetonka; Ernest L. Stelzer, Minnetonka, all of Minn.

[73] Assignee: Honeywell Inc., Minneapolis, Minn.

[22] Filed: July 17, 1975

[21] Appl. No.: 596,890

[52] U.S. Cl. .................. 357/61; 357/65; 357/67; 357/68; 357/71

[51] Int. Cl.$^2$ ............... H01L 29/161; H01L 23/48; H01L 29/46; H01L 29/62

[58] Field of Search .............. 357/61, 65, 67, 68, 357/71

[56] References Cited
UNITED STATES PATENTS

| | | |
|---|---|---|
| 3,214,654 | 10/1965 | Armstrong et al. ............... 357/61 |
| 3,432,729 | 3/1969 | Dyre ............................... 357/61 |
| 3,530,014 | 9/1970 | Antell ............................. 357/61 |
| 3,743,553 | 7/1973 | Scott .............................. 357/61 |
| 3,767,482 | 10/1973 | Kock et al. ..................... 357/67 |
| 3,779,803 | 12/1973 | Lee et al. ....................... 357/61 |

*Primary Examiner*—Andrew J. James
*Attorney, Agent, or Firm*—David R. Fairbairn

[57] ABSTRACT

Ohmic contacts to p-type mercury cadmium telluride are prepared by depositing a Column IB metal on a surface of the p-type mercury cadmium telluride, depositing a buffer material on the Column IB metal, and contacting the buffer material with a bonding material which is capable of alloying with the Column IB metal. The buffer material prevents alloying between the Column IB metal and the bonding material.

16 Claims, 11 Drawing Figures

OHMIC CONTACTS TO P-TYPE MERCURY CADMIUM TELLURIDE

ORIGIN OF THE INVENTION

This invention was made in the course of a contract with the Department of the Air Force.

BACKGROUND OF THE INVENTION

The present invention is concerned with mercury cadmium telluride semiconductor devices. In particular, the present invention is directed to the preparation of reliable ohmic contacts to p-type mercury cadmium telluride. For the purposes of this specification, the common chemical equations for mercury cadmium telluride, (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g$=1.6 eV), with mercury telluride, which is a semi-metal having a negative energy gap of about −0.3 eV. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths from about 1 to 30 microns.

In the prior art, techniques have been developed for making ohmic contact to p-type (Hg,Cd)Te. For example, one technique involves the deposition of gold on a p-type (Hg,Cd)Te surface. The gold and the (Hg,Cd)Te are then heated to cause diffusion of the gold into the (Hg,Cd)Te. In this manner, a higher conductivity p-type region (a "p+ region") is formed near the gold contact. Electrical leads are then attached to the gold with a bonding material such as an indium solder.

The prior art techniques, however, have not been completely satisfactory in making reliable ohmic contacts to p-type (Hg,Cd)Te. In particular, the prior art contacting techniques have proved to be unsatisfactory at very low temperatures (for example, less than about 50° K). At these low temperatures, the prior art contacts tend to exhibit non-ohmic behavior and excess noise.

Because of the vapor pressures of the constituents of (Hg,Cd)Te, the material cannot be heated above about 700° K for any extended period without changing the electrical properties. Any successful contacting technique for (Hg,Cd)Te, therefore, must be capable of being performed at less than about 700° K. This limits the bonding materials which may be used to materials having a low melting point.

SUMMARY OF THE INVENTION

The present invention is a reliable ohmic contact for p-type (Hg,Cd)Te. The ohmic contact of the present invention includes a Column IB metal which is in contact with the p-type (Hg,Cd)Te. A buffer material is in contact with the Column IB metal. The buffer material, in turn, is contacted with a bonding material. The buffer material prevents alloying of the bonding material with the Column IB metal.

DETAILED DESCRIPTION OF THE PREFERRED EMBODIMENTS

Figure 1:
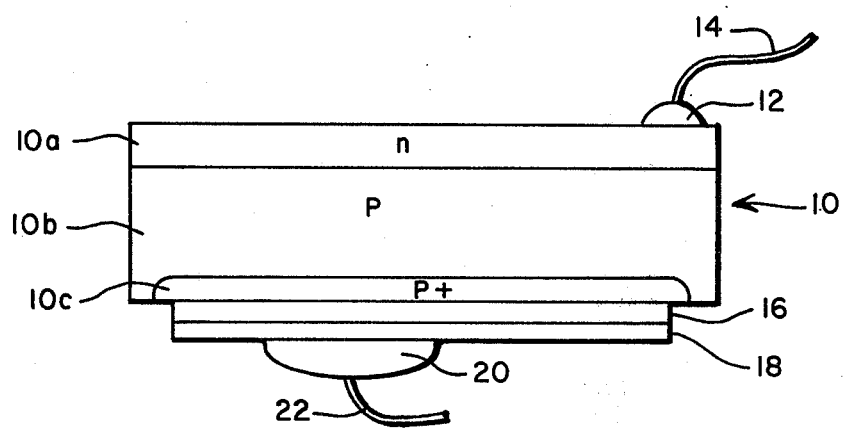
FIGS. 1 and 2 show mercury cadmium telluride photodiodes utilizing the ohmic contact of the present invention.

FIG. 1 shows a mercury cadmium telluride photodiode. The photodiode is formed from the body 10 of (Hg,Cd)Te having n-type region 10a, p-type region 10b, and p+ region 10c. Attached to n-type region 10a is a contact 12, which is preferably of a donor material such as indium. Lead wire 14 is attached to contact 12.

The ohmic contact of the present invention is made to p-type region 10b. The ohmic contact includes p+ region 10c, layer 16 of a Column IB metal, buffer layer 18, and bond 20. Electrical lead 22 is attached by bond 20.

Bond 20 is a low melting point material. Indium, aluminum, and alloys thereof are the preferred materials for bond 20. However, any low melting point metal or alloy is suitable.

Suitable low melting point materials generally act as donor materials in (Hg,Cd)Te. It has been discovered that donor materials forming bond 20 are generally capable of alloying with the Column IB metal (i.e. gold, silver, or copper) of layer 16 at relatively low temperatures (for example, less than about 700° K). If buffer layer 18 is not provided, the donor material of bond 20 alloys with the Column IB metal during fabrication of the (Hg,Cd)Te device. The resulting alloy contains ions which are donors in (Hg,Cd)Te. A donor type alloy can cause undesirable surface states or potential barriers such as junctions which result in non-ohmic or noisy contacts to p-type (Hg,Cd)Te.

Buffer layer 18 is interposed between layer 16 and bond 20 to prevent this undesirable alloying. The buffer material is any material which is capable of preventing alloying between layer 16 and bond 20. The buffer material is generally effective if it does not alloy with the Column IB metal or react with the bonding material at temperatures less than about 700° K.

In a preferred embodiment of the present invention the buffer material is a transition metal (e.g. iron, nickel, chromium, or cobalt). These metals are relatively easy to deposit and adhere well to Column IB metals. Nickel has been found to be particularly advantageous as the buffer material.

P+ region 10c, which is proximate layer 16, is typically formed by diffusion of the Column IB metal into the p-type (Hg,Cd)Te. The p+ region 10c assures good ohmic contact between the (Hg,Cd)Te and layer 16.

Figure 2:
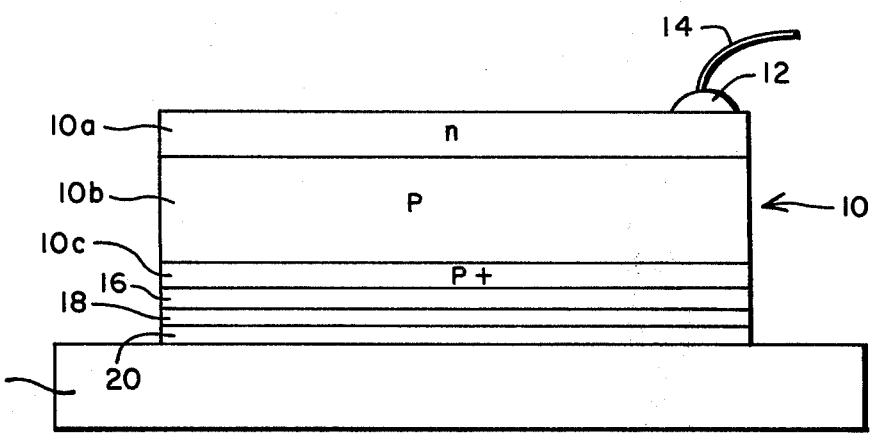

FIG. 2 shows another mercury cadmium telluride photodiode utilizing the ohmic contact of the present invention. The device of FIG. 2 is similar to the device of FIG. 1, and similar numerals and letters have been used to designate similar elements.

The photodiode of FIG. 2 differs from that of FIG. 1 in that the photodiode is attached to a conductive substrate 24 by bond 20. In preferred embodiments of the present invention, conductive substrate 24 is a copper substrate, bond 20 is an indium solder, buffer layer 18 is nickel, and layer 16 is gold.

FIGS. 3a – 3i show the fabrication steps used to form a p-type (Hg,Cd)Te photoconductive detector having the ohmic contacts of the present invention. For the purposes of simplifying the discussion, a preferred embodiment in which the Column IB metal is gold, the buffer material is nickel, and the donor or contact material is indium will be described. It will be understood, however, that the process described is also applicable to other materials.

Figure 3A:
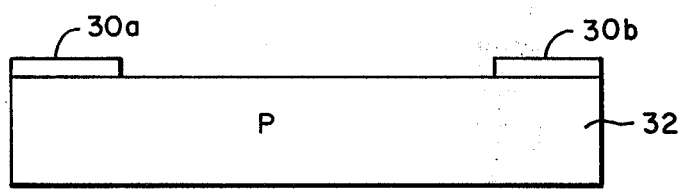
FIGS. 3a – 3i show the fabrication steps of a mercury cadmium telluride photoconductive detector having the ohmic contacts of the present invention.

In FIG. 3a, gold layers 30a and 30b have been deposited on a surface of p-type mercury cadmium telluride body 32. Layers 30a and 30b are deposited by the standard evaporation techniques.

Figure 3B:
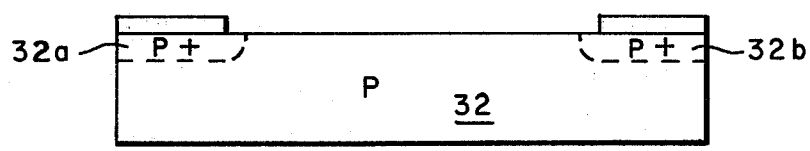

The gold layers 30a and 30b and the p-type body 32 are then heated in a controlled atmosphere to diffuse gold into p-type body 32. The resulting higher conductivity (p+) regions 32a and 32b are shown in FIG. 3b. In the preferred embodiments, the diffusion is at a temperature of between about 500° K and about 600° K for about 10 minutes in a reducing atmosphere such as hydrogen.

Figure 3C:
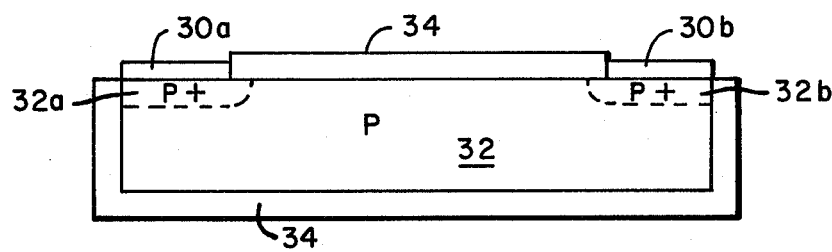

In FIG. 3c, the remaining portions of p-type body 32 are covered by mask 34. Mask 34 is any one of many mask materials which are well-known in the semiconductor fields.

Figure 3D:
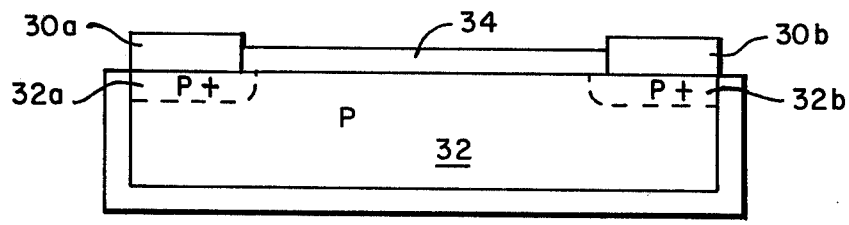

The initial contacts 30a and 30b formed by vapor deposition have thickness of about 2000A. It has been found to be advantageous to increase this thickness by electroplating additional gold. FIG. 3d shows the device after the thickness of layers 30a and 30b have been increased by electroplating. In one embodiment, an additional 2000A of gold is deposited on contacts 30a and 30b using a commercial acid gold process, Engelhard E-56.

Figure 3E:
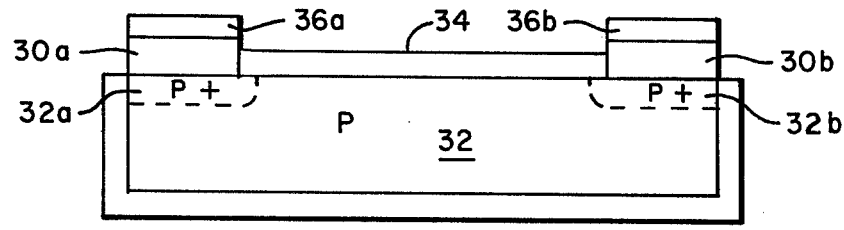

In FIG. 3e, buffer layers 36a and 36b are deposited on layers 30a and 30b, respectively. In one preferred embodiment, layers 36a and 36b are formed by electroless nickel plating. The nickel plating solution is as follows:

| | |
|---|---|
| 30 g/l | $NiCl_2 \cdot 6H_2O$ |
| 50 g/l | $NaH_2PO_2 \cdot H_2O$ |
| 50 g/l | $NH_4Cl$ |
| 10 g/l | $Na_3C_6H_5O_7 \cdot 2H_2O$ |

Prior to plating, a small amount of ammonia is added to the solution and the solution is heated to about 330° K. The thickness of 36a and 36b is preferably about 2000A.

Figure 3F:
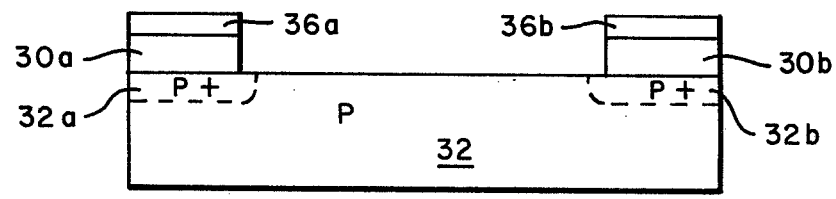

Mask 34 is removed from p-type body 32. The resulting structure is shown in FIG. 3f.

Figure 3G:
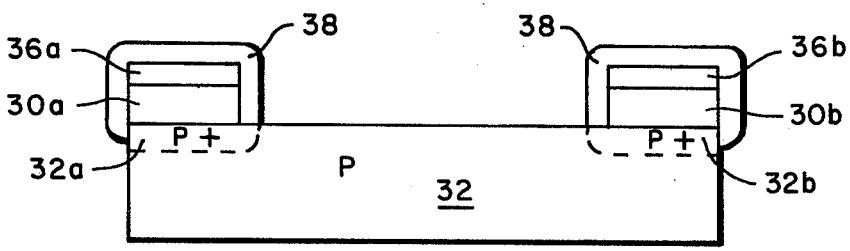

Mask 38 is then deposited over the entire contact area, as shown in FIG. 3g. The remainder of (Hg,Cd)Te body 32 is left exposed.

Figure 3H:
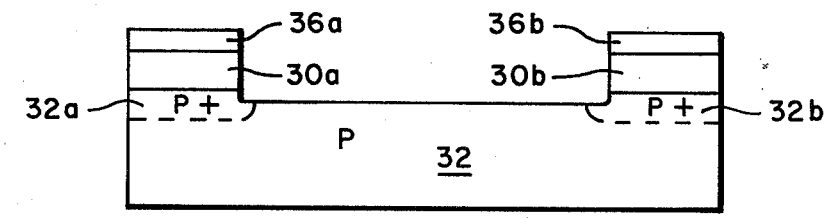

Body 32 is then cleaned and etched, preferably by etching body 32 for about 30 to 60 seconds in a 5% bromine-alcohol solution. The resulting structure, after mask 38 is removed, is shown in FIG. 3h.

Figure 3I:
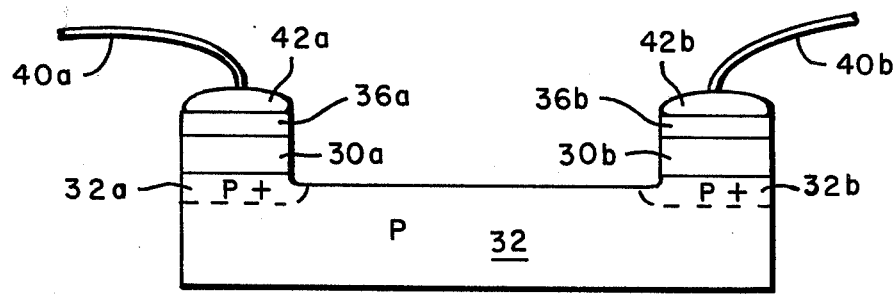

In FIG. 3i, lead wires 40a and 40b are attached by bonds 42a and 42b, respectively. Bonds 42a and 42b are preferably an indium containing solder.

Experiments have shown that nickel buffer layers 36a and 36b are effective in preventing alloying between the gold of layers 30a and 30b and the indium of bonds 42a and 42b. The resulting contacts have been tested at temperatures from 300° K to as low as 4.2° K and have exhibited ohmic behavior at all temperatures.

In conclusion, the present invention is a highly advantageous ohmic contact for p-type (Hg,Cd)Te. The contact of the present invention is particularly advantageous when the (Hg,Cd)Te device will operate at temperatures of less than about 50° K. Even for higher temperature operation (T> 50° K), this contacting technique results in a higher yield of good ohmic contacts than the prior art techniques.

Although the present invention has been disclosed with reference to preferred embodiments, workers skilled in the art will recognize that changes may be made in form and detail without departing from the spirit and scope of the invention.

The embodiments of the invention in which an exclusive property or right is claimed are defined as follows:

1. An electrical contact to p-type mercury cadmium telluride, the contact comprising:
   a first amount of a Column IB metal in contact with the p-type mercury cadmium telluride;
   a second amount of a low melting temperature material; and
   a third amount of a buffer material interposed between the first amount and the second amount to prevent alloying of the first and second amounts.

2. The electrical contact of claim 1 and further comprising:
   a region in the p-type mercury cadmium telluride proximate the first amount, the region containing Column IB ions.

3. The electrical contact of claim 2 wherein the region is formed by diffusion.

4. The electrical contact of claim 3 wherein the Column IB metal is gold.

5. The electrical contact of claim 1 wherein the buffer material is a transition metal.

6. The electrical contact of claim 5 wherein the buffer material is nickel.

7. The electrical contact of claim 1 wherein the material of the second amount is of the group consisting of indium, aluminum, and alloys thereof.

8. The electrical contact of claim 1 wherein the Column IB metal is gold, the low melting temperature material is indium, and the buffer material is nickel.

9. The electrical contact of claim 8 and further comprising:
   a region in the p-type mercury cadmium telluride proximate the first amount, the region containing Column IB ions.

10. The electrical contact of claim 1 wherein the low melting temperature material is of the group of materials which are donors in mercury cadmium telluride and which are capable of alloying with the Column IB metal at a temperature less than about 700° K.

11. The electrical contact of claim 10 wherein the buffer material is of the group of materials which do not substantially alloy with the Column IB metal or substantially react with the low melting temperature bonding material at a temperature less than about 700° K.

12. An electrical contact for use with a mercury cadmium telluride semiconductor device, the electrical contact comprising:
   a first amount of a Column IB metal;
   a second amount of a material of the group consisting of indium, aluminum, alloys of indium, and alloys of aluminum; and a third amount of a buffer material interposed between the first amount and the second amount to prevent alloying of the first and second amounts.

13. The electrical contact of claim 12 wherein the Column IB metal is gold.

14. The electrical contact of claim 12 wherein the buffer material is a transition metal.

15. The electrical contact of claim 12 wherein the buffer material is nickel.

16. The electrical contact of claim 15 wherein the Column IB metal is gold, and the material of the second amount is indium.

* * * * *